(12) United States Patent
Van Gisbergen et al.

(10) Patent No.: US 9,213,798 B2
(45) Date of Patent: Dec. 15, 2015

(54) METHOD, SYSTEM AND COMPUTER PROGRAM PRODUCT OF CHECKING AN INTEGRATED CIRCUIT LAYOUT FOR INSTANCES OF A REFERENCE PATTERN

(75) Inventors: Jozefus Godefridus Gerardus Pancratius Van Gisbergen, Hilvarenbeek (NL); Daniel James Blakely, Yokohama (JP); Rob Oomens, Eindhoven (NL); Jacob Zelnik, Sunnyvale, CA (US)

(73) Assignee: SAGE DESIGN AUTOMATION LTD, Haifa (IL)

( * ) Notice: Subject to any disclaimer, the term of this patent is extended or adjusted under 35 U.S.C. 154(b) by 113 days.

(21) Appl. No.: 14/117,387

(22) PCT Filed: May 15, 2012

(86) PCT No.: PCT/EP2012/058999
§ 371 (c)(1),
(2), (4) Date: Nov. 13, 2013

(87) PCT Pub. No.: WO2012/156395
PCT Pub. Date: Nov. 22, 2012

(65) Prior Publication Data
US 2015/0154340 A1      Jun. 4, 2015

Related U.S. Application Data

(60) Provisional application No. 61/487,763, filed on May 19, 2011.

(51) Int. Cl.
*G06F 17/50* (2006.01)
(52) U.S. Cl.
CPC ................................. *G06F 17/5081* (2013.01)

(58) Field of Classification Search
None
See application file for complete search history.

(56) References Cited

U.S. PATENT DOCUMENTS

| 7,503,029 B2 * | 3/2009 | Sinha et al. ..................... 716/51 |
| 7,657,852 B2 * | 2/2010 | Waller ........................ 716/119 |
| 8,122,407 B2 * | 2/2012 | Monkowski .................. 716/111 |
| 8,640,079 B2 * | 1/2014 | Majumder et al. ............ 716/139 |
| 8,769,474 B1 * | 7/2014 | Gennari et al. ............... 716/139 |
| 2007/0044060 A1 | 2/2007 | Waller et al. |
| 2010/0185994 A1 * | 7/2010 | Pikus et al. ..................... 716/5 |

OTHER PUBLICATIONS

Niewczas et al., "An Algorithm for Determining Repetitive Patterns in Very Large IC Layouts", *IEEE*, vol. 18, No. 4, Apr. 1, 1999, pp. 494-501.
Liang et al., "Effective sketch retrieval based on its contents", *Machine Learning and Cybernetics*, vol. 9, Aug. 18, 2005, pp. 5266-5272.
International Search Report for PCT/EP2012/058999, mailed Sep. 6, 2012.
Written Opinion for PCT/EP2012/058999, mailed Sep. 6, 2012.

* cited by examiner

*Primary Examiner* — Leigh Garbowski
(74) *Attorney, Agent, or Firm* — Nixon & Vanderhye, P.C.

(57) ABSTRACT

A method 100, a computer program product and a system of checking an integrated circuit layout for instances of a reference pattern is provided The method 100 comprises the steps of: i) receiving 102 the integrated circuit layout, ii) receiving 104 a drawing of the reference pattern from a user, iii) deducting 106 a basic pattern definition from the drawn reference pattern, iv) determining 108 a set of topological relation based on the drawn reference pattern, v) forming 110 a complex pattern description which is a combination of the deducted basic pattern definition and the set of topological relations, vi) checking 112 the integrated circuit layout for patterns that match the complex pattern description to find instances of the reference pattern in the integrated circuit layout, and vii) storing 114 found instances of the reference pattern.

19 Claims, 11 Drawing Sheets

METHOD, SYSTEM AND COMPUTER PROGRAM PRODUCT OF CHECKING AN INTEGRATED CIRCUIT LAYOUT FOR INSTANCES OF A REFERENCE PATTERN

This application is the U.S. national phase of International Application No. PCT/EP2012/058999 filed 15 May 2012 which designated the U.S. and claims priority to U.S. Provisional Application No. 61/487,763 filed 19 May 2011, the entire contents of Each of which are hereby incorporated by reference.

FIELD OF THE INVENTION

The invention relates to the field of methods and systems of checking an integrated circuit layout for complex patterns which are relatively difficult to manufacture on an integrated circuit device.

BACKGROUND OF THE INVENTION

An integrated circuit device is manufactured based on a physical design which describes how the device has to be built up. Integrated circuit devices are stacks of layers of different materials. Each layer locally comprises features of the material, such as metal wires in a metal layer, or locally comprises an adapted material, such as a locally created p-diffusion in an n-well area in a semiconductor material for manufacturing a pmos transistor. The integrated circuit layout geometrically describes where the features have to be created or where the material has to be adapted. The layout is the basis for manufacturing a plurality of masks which are used in a lithographical process to manufacture the design of the layout on the semiconductor device. See, for example, patent application US2003/192013, which discusses how the physical layout is adapted to manufacture a plurality of masks and how the masks are used to manufacture the layers of the semiconductor device.

Nowadays, the features of the integrated circuit become very small and, in general, they are difficult to manufacture on the integrated circuit device. Some patterns are very difficult to manufacture and must, for example, be avoided, or have to be adapted to a less difficult manufacturable pattern.

Traditionally, see for example patent U.S. Pat. No. 6,189, 132 and patent application US2003/009728, the prevention of manufacturability problems was based on enforcing minimal distances between the features of the integrated circuit and enforcing minimal spaces between the features. Tools which were used to enforce the minimal distances were able to detect instances of widths of the features and instances of spaces between the features.

In other tools, a geometrical description of a relative complex pattern is provided to a pattern matching tool which is only capable of finding exact copies of the pattern in the physical layout, which means that only instances of the pattern which have exactly the same size are found. However, variations of the geometrically described pattern may also have manufacturability problems.

Without being bound to an exact geometry, relatively complex patterns may be specified with SVRF of Mentor Graphics. SVRF stands for Standard Verification Rule Format. SVRF is a language for specifying violations against design rules in a layout. If a design rule is specified, a Mentor Graphics tool is used to execute the algorithm and detect violations of the design rule in a physical layout. The specification of the design rule is achieved by means of algorithms that compute error layers for each fault situation. It is up to the implementer of a design rule to develop these algorithms. The algorithms are written using operations on layers of the physical layout, or selecting edges or shapes of layout features. For more complex patterns this quickly leads to hard-to-write and hard-to-read design rule descriptions and consequently they are hard to maintain and hard to debug. Thus, SVRF is not a user-friendly solution for defining certain complex patterns. Further, some complex patterns can not be described in SVRF.

SUMMARY OF THE INVENTION

It is an object of the invention to provide a method and system of checking an integrated circuit layout for complex patterns which is more user-friendly.

A first aspect of the invention provides a method of checking an integrated circuit layout for a complex pattern as claimed in claim 1. A second aspect of the invention provides a computer program product as claimed in claim 17. A third aspect of the invention provides a system as claimed in claim 18. Advantageous embodiments are defined in the dependent claims.

A method of checking an integrated circuit layout for instances of a reference pattern in accordance with the first aspect of the invention comprises a step of receiving the integrated circuit layout. The integrated circuit layout represents a design of an integrated circuit device. The reference pattern being a topology of one or more integrated circuit layout elements. In another step, a drawing of the reference pattern is received from a user. In a further step, a basic pattern definition is deducted from the drawn reference pattern. The basic pattern definition comprises one or more sequences of one or more successive edges corresponding to lines in the drawn reference patterns and further comprises corners corresponding to extremities of the lines in the drawing. A corner is a first point of a first edge of the sequence, is a last point of a last edge of the sequence, or is a common point of two successive edges of the sequence. In another step, a set of topological relation is determined based on the drawn reference pattern. The topological relations are defined between pairs of two edges of the basic pattern definition, between pairs of two corners of the basic pattern definition and/or between pairs of one edge and one corner of the basic pattern definition. The topological relation defining a specific topology between the corners and/or edges of the pairs. In another step a complex pattern description is formed which is a combination of the deducted basic pattern definition and the set of topological relations. In a step of the method the integrated circuit layout is checked for patterns that match the complex pattern description to find instances of the reference pattern in the integrated circuit layout. In a further step, found instances of the reference pattern are stored.

The reference pattern is drawn by a user, which allows the user to provide the reference pattern in an intuitive way. When providing the drawing of the reference pattern, for example, by drawing a sequence of connected lines, the user does not have to know which specific formal definition has to be provided. The user just draws one or more (parts of) shapes of which he believes that it specifies at least a topology that is related to the topology of the complex pattern. The method provides subsequent steps to translate the drawn (parts of) shapes into a formal description of the complex pattern.

The step of deducting the basic pattern definition is a step wherein basic pattern information is detected from the reference pattern. The received reference pattern has one topology, namely the drawn topology, and, if drawn in a specific coordinate system, a specific geometry is specified by the reference pattern. The deducted basic pattern definition comprises a limited amount of topological information of all the topological information that is present in the reference pattern. The deducted basic pattern definition is built up on basis of the pattern elements edges and corners. Edges correspond to lines drawn in the reference pattern. The topological information in the deducted basic pattern that is related to the edges is information about which edges form sequences of edges and in which order do they form a sequence. Corners correspond to extremities of lines in the drawing of the reference pattern. The topological information of the corners present in the deducted basic pattern definition is whether the corner is a first point of a first edge of a sequence of edges, whether the corner is a last point of the last edge of a sequence of edges, or whether the corner is a common point of two successive edges of a sequence of edges. In contrast to the received reference pattern, the basic pattern definition still describes a wide range of topologies and geometries. In the process of deducting the basic pattern definition, drawn lines are mapped onto the formal entity of an edge. Extreme points of the drawn lines are mapped onto corners. Further, the subsequent information is deducted: adjacency of edges, which means in the context of the basic pattern definition, which edge is connected to which other edge, which means in the context of the reference pattern, which line in the drawing is connected to which other line The user may draw one sequence of lines or more sequences of lines, and thus, the basic pattern definition comprises one or more sequences of successive edges.

As discussed, the basic pattern definition still describes a wide variety of topologies and geometries and the reference pattern received from the user represents one specific topology. However, the complex pattern for which the integrated circuit layout has to be checked, has not necessarily only the topology of the reference pattern and has not necessarily the all possible topologies of the basic pattern definition. For example, when the user draws the shape of a point symmetric 'H' (see, for example, FIG. 4a), the basic pattern definition that is deducted form the drawn 'H' also describes patterns that looks like a rotated 'S' or an 'N' (see, for example, FIG. 4c). In this case, the user most probably meant to define patterns that still look like an 'H' and, therefore, it is necessary to define that the middle 'leg' of the 'H' consists of two edges (edges e3 and e9 in FIG. 4b) that have a common run length, which means that the edges have to be parallel, that they face each other and that in between the edges there is an area that touches both edges and that the area is free of other edges. This is a topological relation between two edges of the basic pattern definition and the method provides the step of determining a set of topological relations which describe together with the basic pattern definition the topology of the complex pattern for which the integrated circuit layout has to be checked. Therefore, in the step of selecting topological relations, a choice is made out of all possible topological relations that are present in the reference pattern to obtain a set of topological relations that have to be present in the complex pattern. The set of topological relations and the basic pattern definition are combined to form a complex pattern description.

If the complex pattern description is formed, the integrated circuit layout is checked for instances of the reference pattern which match with the complex pattern description. The found instances are stored, for example, in a database, in a memory or on a computer readable medium. The stored information is for later use and/or use by other methods, systems or tools. In an example, the stored information may be used by tools which automatically adapt the found instances to better manufacturable complex patterns. The found instances may also be presented together with the integrated circuit layout to an integrated circuit designer who manually adapts the found instances of the pattern. Thus, the data, which is created by the method, is used to improve the quality of the patterns of the integrated circuit layout and, thus, to improve the yield of the manufacturing of the integrated circuit devices and/or to improve the quality of the integrated circuit devices. It is further to be noted that the storing of the found instances may be a temporary storing. For example, the instances are stored for another tool which further processes the found instances, and after providing the instances of the reference pattern the another tool, the instances may be deleted from the storing means.

The method provides a user-friendly way of finding matches of a complex pattern in an integrated circuit layout. The method allows the user to provide in an intuitive way a drawing of the reference pattern of which he believes that the topology is related to the topology for which the integrated circuit layout has be checked. The user does not have to have knowledge about the particulars of the complex pattern definition, and, thus, the user is able to specify for which pattern the integrated circuit layout has to be checked instead of how the pattern has to be found. In subsequent steps the drawing is translated in a formal definition of the complex pattern description, which is not necessarily bound to the single topology of the reference pattern and the geometry of the reference pattern. Consequently, the method is a powerful solution for finding complex patterns in an integrated circuit layout based on the drawing of the reference pattern, which is for a user the most intuitive way of defining such a complex pattern.

It is to be noted that the invention relates to methods and systems which are used to discover difficult manufacturable patterns. The invention does not relate to simple patterns, such as the width of a feature or a space between two features, but relates to complex patterns which may comprise several edges arranged in a specific topology with respect to each other. It is further to be noted that the invention also relates to methods and systems which are used to check a layout for design rule violations. Design rules comprise requirements for a specific reference pattern. The invention may be used to find the specific reference pattern.

In a further embodiment, the method comprises the step of presenting the determined set of topological relations in the drawing of the reference pattern. The step provides feedback to the user about the set of topological relations, which is especially user-friendly for users who understand the impact of such relations. It also opens the possibility for users to adapt the set of topological relations, which is especially advantageous when the set of topological relations is automatically deducted from the drawing of the reference pattern.

In another embodiment, the method comprises the step of receiving topological relation input from the user. The topological relation input comprises a definition of one or more specific topological relations in the drawing. The method further comprises the step of adding the specific topological relations to the determined set of topological relations on basis of the topological relation input. The user has often knowledge about one or more specific topological relations that have to be present in the set of topological relations. It is user-friendly to provide the user the opportunity to specify the topological relations if they are not presents in the set of determined set of topological relation such that they can be added to the determined set of topological relations.

In an embodiment, the method comprising the step of receiving further topological relation input from the user. The further topological relation input comprises a selection of one or more topological relations of the determined set of topological relations. The method further comprises the step of removing the selected topological relations from the determined set of topological relations on basis of the further topological relation input. The user has often knowledge about one or more specific topological relations that have not to be present in the set of topological relations, because the method has also to find instances of the reference pattern without these specific topological relations. Further, it is possible that the determined set of topological relations comprises too much topological relations. If these topological relations are, for example, presented in the drawing of the reference pattern, the user may provide the further topological relation input by selecting a subset of the presented set of determined topological relations. The user experiences the additional control according to the embodiment as convenient.

In another embodiment, the method comprises the step of receiving a line selection from the user. The line selection is an indication of lines of the drawn reference pattern that are relevant for the checking of the integrated circuit layout for instances of the reference pattern. The line selection is taken into account in the steps of deducting a basic pattern definition and determining a set of topological relations. In most cases the user knows which lines of the drawing of the reference pattern are most important in the reference pattern, and which drawn lines are irrelevant. The user may indicated the relevant lines in the drawing of the reference pattern such that in subsequent steps only the relevant lines are translated into relevant edges and sequences of relevant edges, and only topological relations between relevant edges and/or corners of relevant edges are deducted. It may also be possible that the user, by accident, draws too many lines in the drawing of the reference pattern and the embodiment provides a possibility to correct the drawn reference pattern. The additional control provided by the embodiment is experienced by users as a user-friendly option.

In another embodiment, the integrated circuit layout comprises polygons which represent integrated circuit layout elements or parts of integrated circuit layout elements. The sequence of successive edges defines at least a portion of a polygon. The basic pattern definition further defines a side of each edge of the sequence of successive edges which faces an interior of the portion of the polygon. Especially, if the sequence of successive edges does not form a closed polygon, it is not clear which side of the edges is the interior of the polygon. This information is relevant, because in a later step the portion of the polygon has to be found in an integrated circuit layout which comprises closed polygons. Of the closed polygons it is a priori clear which side of the edges of the polygon face to the interior of the polygon. If the basic pattern definition does not unambiguously define which side of the edges faces towards the interior of the portion of the polygon, the step of checking the integrated circuit layout for patterns that match the complex pattern description may find instances that do match, for example, a space in between polygons, while the intention of the user was to define that a polygon has to be found.

The information of which side of the edges faces the interior of the polygon may be explicitly or implicitly indicated by the user. The information is, for example, implicitly indicated, if according to an agreement, the drawn sequence of lines always follows a boundary of a polygon clockwise.

In a further embodiment, the integrated circuit layout comprises a layer which represents a layer of the integrated circuit device or a part of the layer of the integrated circuit device. It is a part of the layer, if, for example, the manufactured layer of the integrated circuit device is the result of two different layers in the integrated circuit layout. The basic pattern definition further defines a layer property of each sequence of edges. In the step of checking the integrated circuit layout for patterns that match the complex pattern description also takes into account the layer property. The layer property of each sequence of edges may be relevant because the complex pattern may relate to one or different layers in the integrated circuit layout, and if it is not known in which layer which sequence of edges has to be found, erroneous instances of the complex patterns may be found. For example, a complex pattern of a transistor comprise most probably a sequence of edge that has to be found in the poly layer, sequences of edges that have to be found in the contact layer, and another sequence of edges that has to be found in the layer(s) which specifies the location of p-diffusions or n-diffusions in the semiconductor substrate. The user may explicitly indicate the layer properties of each sequence of lines of the drawing of the reference pattern.

In an embodiment, each one of the topological relations of topological relations is of a type which is part of a predetermined set of topological relation types. The predetermined set of topological relation types comprises the topological relation types between:

i) a first edge and a second edge being adjacent in a sequence of edges of the basic pattern definition and having a specific angle between the first edge and the second edge, ii) a first corner and a second corner, the first corner being a point of a first specific edge or being a point of a first specific edge and a second specific edge, the second corner being a point of a third specific edge or being a point of a third specific edge and a fourth specific edge, the first corner being diagonally opposite the second corner meaning that the first corner and the second corner have a smallest distance among all possible point pairs of a point of the first specific edge or of the second specific edge, and a point on the third specific edge or of the fourth specific edge, iii) a first corner and a second corner being diagonally opposite, no edges other than edges connected to the first corner and to the second corner being present in an area defined by points being in between the first corner and the second corner and being closer to the first corner than to the edges connected to the first corner or being closer to the second corner than to the edges connected to the second corner, iv) a corner and an edge, the corner being a common point of a first specific edge and a second specific edge, the corner and the edge having a smallest distance between the corner and a specific point on the edge among all point pairs comprising a point on the edge and a point on a first specific edge or on a second specific edge, no edges cross a line that connects the corner with the specific point except the edge, the first specific edge and the second specific edge, v) a first edge and a second edge, the first edge crossing the second edge, vi) a first edge and a second edge, the first edge being parallel to the second edge, vii) a first edge and a second edge, the first edge being parallel to the second edge and an interior side of the first edge facing away from an interior side of the second edge, viii) a first edge and a second edge, the first edge being parallel to the second edge and an interior side of the first edge facing towards an interior side of the second edge, ix) a first edge and a second edge, the first edge being parallel to the second edge and an interior side of the first edge facing towards an exterior side of the second edge, x) a first edge and a second edge, the first edge being parallel to the second edge and the first edge having a common run length with the second edge, xi) a first edge and a second edge, the first edge being parallel to the second edge, the first edge having a common run length with the second edge, and no other edge being present in a rectangular portion of an area between the first edge and the second edge along their common run length, the rectangular portion of the area touching the first edge and touching the second edge, and xii) a first edge and a second edge, the first edge being parallel to the second edge, the first edge having a common run length with the second edge, and no other edge being present in an rectangular area between the first edge and the second edge along their common run length, the rectangular area touching the first edge and touching the second edge.

With the types of topological relations of the predetermined set of topological types one is able to describe a wide variety of topologies in detail. Thus, the method provides a way of specifying in detail for which topology the integrated circuit layout has to be checked.

The types of the topology relations are possible topology relations between two entities of the basic pattern definition and is in certain types are also defined with respect to other edges or corners of the integrated circuit layout that are not comprised in the pair. In principle, this means that they are defined with respect to all other edges or all other corners of the integrated circuit layout. However, in practice, the topology is a local phenomenon and, if in the definition the topology relates to other edges or other corners, it means that the topology between the two entities relates to other edges or other corners in a small environment around the two entities.

In an embodiment, the step of matching the complex pattern description comprises the steps of i) transforming the complex pattern description to a graph representation of the complex pattern definition, ii) transforming the integrated circuit layout to a graph representation of the integrated circuit layout, iii) finding instances of the graph of the complex pattern description in the graph of the integrated circuit layout for finding instances of the reference pattern. Finding instances of a graph in another graph is a mathematical problem for which efficient and effective solutions are known. Thus, when the complex pattern description and the integrated circuit layout are each transformed into a graph representation, a method for finding instances of a graph in another graph may be used to find instances of the reference pattern in the integrated layout.

In a further embodiment, the step of transforming the integrated circuit layer comprises determining topological relations in the integrated circuit layout. Automatic methods for finding topological relations in an integrated circuit layout are known in the art, for example, a method as described in patent application WO2008116807 may be used for this purpose. It is to be noted that the automatic method for finding topological relations may also be used to find topological relations in the drawing of the reference pattern as soon as lines of the drawing are translated into edges and sequences of edges. Consequently, the method may be useful in the step of deducting the topological relations on basis of the drawn reference pattern.

In an embodiment, the step of the transforming of the complex pattern description to the graph representation comprises i) mapping edges of the complex pattern description on a set of vertices of the graph representation, and ii) mapping the topology of the basic pattern definition and the topological relations of the complex pattern description on a set of edges of the graph representation, and/or the step of transforming of the integrated circuit layout to the graph representation comprises i) mapping edges of the integrated circuit layout on a set of vertices of the graph representation, and ii) mapping a basic topology of the integrated circuit layout and the determined topological relations of the integrated circuit layout on a set of edges of the graph representation.

In another embodiment, the method comprises the step of receiving one or more geometrical predicates. A geometrical predicate defines a specific geometry of a specific topology of the reference pattern. In the step of forming a complex pattern description the received geometrical predicates are further included in the complex pattern description. The step of checking the integrated circuit layout for patterns that match the complex pattern description further takes into account the received geometrical predicates. Geometry relates to quantifiable characteristics of one or more elements of an integrated circuit. As far as these quantifiable characteristics relate to elements of the complex pattern description (for example, relate to edges, corners, sequence of edges, and/or topological relations) a user may provide the quantifiable characteristics as geometrical predicates. Examples of geometrical predicates are: a length of an edge, a length of a sequence of edges, a distance between pairs of edges and/or of corners, an area enclosed by a sequence of edges, a position of an edge or a corner in an integrated circuit layout with respect to a predefined reference point, a number of layout elements in a specific region, and/or the density of layout elements in a specific region of the layout. It is to be noted that the geometrical predicates may be expressed as conditions on the values, such as the length of an edge should be larger than, the enclosed area should be smaller than, or the distance between edges should be equal to. In addition to only a specific topology, the user may want to find a specific geometry and as such it is user-friendly to provide to the user a possibility to specify the geometry.

In a further embodiment, the method comprises the step of receiving one or more layout property predicates. The layout property predicates are properties describing characteristics of one or more circuit layout elements and are properties that are extractable from the integrated circuit layout. In the step of forming a complex pattern description the received layout property predicates are further included in the complex pattern description. The step of checking the integrated circuit layout for patterns that match the complex pattern description further takes into account the layout property predicates. An integrated circuit layout represents an electronic circuit to be manufactured as an integrated circuit device. The layout property predicates related to the electrical characteristics of the electronic circuit that is represented by the layout. These layout property predicates can be extracted from the layout with specific analysis techniques with focus on the electrical behaviour of the circuit implemented in the integrated circuit layout. Examples of layout property predicates are: an electrical connectivity to specific to specific elements of the integrated circuit layout, being part of a specific electrical net, having a specific parasitic value (such as capacitance or inductance).

In another embodiment, the method comprises the step of receiving a required pattern orientation. The required pattern orientation is an orientation that the instance of the reference pattern has to have in the integrated circuit layout with respect to a predefined reference orientation. In the step of forming a complex pattern description the required pattern orientation is further included in the complex pattern description. The step of checking the integrated circuit layout for patterns that match the complex pattern description further takes into account the required pattern orientation. The pattern orientation is defined with respect to a predefined reference orientation and may be expressed as a specific rotation with respect to the predefined reference orientation. For example, a user may specify that a pattern similar to the letter E has to be found and the user may specify that the required pattern orientation has to be 180°. It may further been specified in the integrated circuit layout that a 'normal' oriented letter E equals a pattern orientation of 0°. The required pattern orientation is a further requirement that may be specified be the user such that a more accurate pattern definition can be obtained.

In an embodiment, the method comprises the step of building a complex Boolean and/or arithmetic expression from the complex pattern description. The step of checking the integrated circuit layout for patterns that match the complex pattern description uses the Boolean and/or arithmetic expression to find instances of the reference pattern in the integrated circuit layout. All different requirements discussed in previous embodiments may be translated towards into a Boolean and/or arithmetic expression which results in an expression that may be used to decide whether instance of a pattern in the integrated circuit layout is an instance of the reference pattern or not.

In another embodiment, the method comprising a step of preprocessing the integrated circuit layout by adapting the received integrated circuit layout on basis of one or more arithmetic operations on elements of the integrated circuit layout. Arithmetic operations are operations which create integrated circuit layout elements on basis of the elements of the input integrated circuit layout according to a specific rule. The operations may be logic operations like "and", "or" or "not". An example is that a temporary imaginary layer is created that is the "and" of two layers of the received integrated circuit layout. The operations may also be geometry oriented operations which undersize or oversize a polygon or a path of an integrated circuit layout. Undersizing means that a size of polygons or paths has to be decreased, oversizing means that the size has to be increased. Any of these arithmetic operations may be combined in any order. It is advantageous to preprocess the received integrated circuit layout if it is know a priori that the reference pattern has to be found in a (according to this embodiment created imaginary) layer which is the result of a sequence of one or more arithmetic operations. Further, in specific situations the step of checking the integrated circuit layout for instances of the reference pattern may be performed more efficiently if the integrated circuit layout is preprocessed. The efficiency gain in this step may be more than the efficiency loss of the preprocessing step.

According to a second aspect of the invention, a computer program product is provided for checking an integrated circuit layout for instances of a complex pattern. The computer program product comprises instructions for causing a processor system to perform the method according to the first aspect of the invention.

According to a third aspect of the invention, a pattern checking system is provided for checking an integrated circuit layout for instances of a complex pattern. The system comprises a layout input means, a pattern input means, a deducting means, a determination means, a forming means, a checking means and a storing means. The layout input means receives the integrated circuit layout. The pattern input means receives a drawing of a reference pattern from a user. The deducting means deducts a basic pattern definition from the drawing. The basic pattern definition comprises a sequence of successive edges corresponding to lines in the drawing, comprises corners corresponding to extremities of the lines in the drawing, and comprises angles between edges. A corner is a first point of a first edge of the sequence, is a last point of a last edge of the sequence, or is a common point of two successive edges. The determination means determines a set of topological relations between pairs of two edges of the basic pattern definition, pairs of two corners of the basic pattern definition or pairs of one edge and one corner of the basic pattern definition. The forming means forms the complex pattern definition from the deducted basic pattern definition and the set of topological relations. The checking means checks the integrated circuit layout for instances of complex patterns that match the complex pattern description. The storing means stores found instances of the complex pattern.

The computer program product according to the second aspect of the invention and the system according to the third aspect of the invention provide the same benefits as the method according to the first aspect of the invention and has similar embodiments with similar effects as the corresponding embodiments of the system.

These and other aspects of the invention are apparent from and will be elucidated with reference to the embodiments described hereinafter.

It will be appreciated by those skilled in the art that two or more of the above-mentioned embodiments, implementations, and/or aspects of the invention may be combined in any way deemed useful.

Modifications and variations of the system, the method, and/or of the computer program product, which correspond to the described modifications and variations of the method, can be carried out by a person skilled in the art on the basis of the present description.

Figure 1:
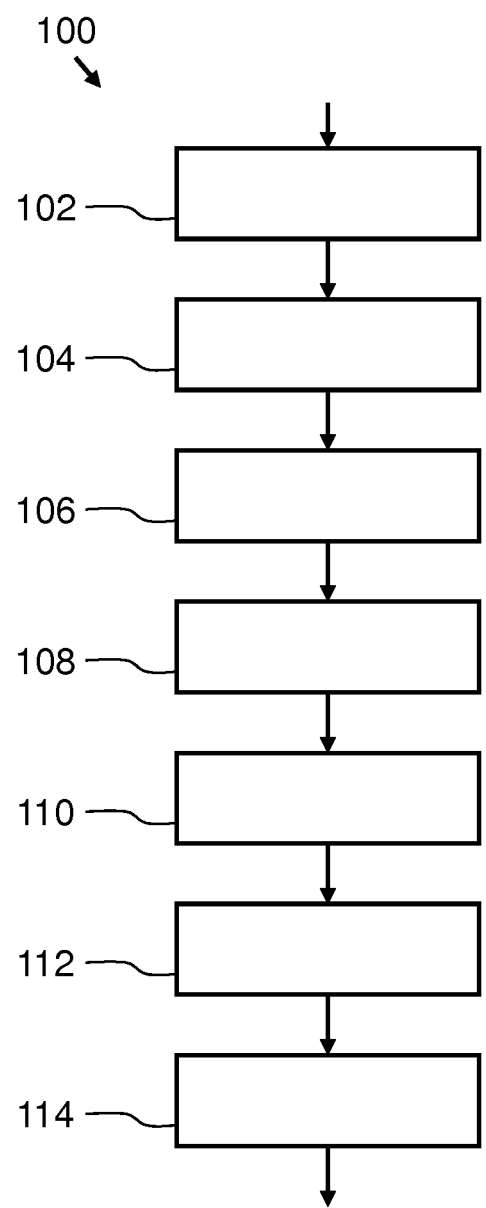
FIG. 1 schematically shows an embodiment of the method of checking an integrated circuit layout for instances of a complex pattern according the first aspect of the invention, FIG. 2 schematically shows another embodiment of the method according to the invention, FIG. 3 schematically shows a part of an integrated circuit layout, FIG. 4a schematically shows a received drawing of a reference pattern, FIG. 4b schematically shows the mapping of lines and extremities of lines to edges and corners of the basic pattern definition, FIG. 4c schematically shows topological and geometrical variations of the basic pattern definition that is deducted from the received reference pattern of FIG. 4a, FIGS. 5a to 5c show types of topological relations, FIG. 6a schematically shows a determined topological relation in the reference pattern, FIG. 6b schematically shows which topological and geometrical variations of FIG. 4c do not have the topological relation shown in FIG. 6a, FIG. 7 schematically shows orientations of edges for explaining the angle between pairs of edges, FIG. 8a schematically shows different areas in the environment of an edge, FIGS. 8b and 8c schematically show topological relations types, FIG. 9a schematically shows a topological relation type, FIG. 9b schematically shows sectors related to a corner of two adjacent edges.

It should be noted that items denoted by the same reference numerals in different Figures have the same structural features and the same functions, or are the same signals. Where the function and/or structure of such an item have been explained, there is no necessity for repeated explanation thereof in the detailed description.

The figures are purely diagrammatic and not drawn to scale. Particularly for clarity, some dimensions are exaggerated strongly

DETAILED DESCRIPTION

A first embodiment is shown in FIG. 1. FIG. 1 shows an embodiment of a method 100 of checking an integrated circuit layout for instances of a complex layout pattern. The complex pattern is a topology of one or more elements of the integrated circuit layout.

In a first step 102 of the method, an integrated circuit layout is received. An integrated circuit layout may comprise layers which correspond to layers of an integrated circuit device or parts of layers of an integrated circuit device. The elements of the layers may be described by polygons, which is a shape that is defined by a closed path of lines.

In a further step 104, a drawing of a reference pattern is received from a user. The user may, for example, draw the reference pattern with a computer program.

Subsequently, in step 106, a basic pattern definition is deducted from the drawing of the reference pattern. The basic he basic pattern definition comprises one or more sequences of successive edges and comprises corners. A corner is a first point of a first edge of the sequence, is a last point of a last edge of the sequence, or is a common point of two successive edges of a sequence of edges. In the process of deducting the basic pattern definition, drawn lines are mapped onto the formal entity of an edge. Extreme points of the drawn lines are mapped onto corners. Further, the subsequent information is deducted: adjacency of edges, which means in the context of the basic pattern definition, which edge is connected to which other edge, which means in the context of the reference pattern, which line in the drawing is connected to which other line.

In step 108, a set of topological relations is determined between pairs of two edges, between pairs of two corners of the basic pattern definition, or between pairs of one edge and one corner of the basic pattern definition.

In step 110, the complex pattern description is formed by combining the deducted basic pattern definition with the set of topological relations.

In step 112, the integrated circuit layout is checked for complex patterns that match the complex pattern description to find instances of the complex pattern.

In step 114, the found instances are stored. For example, the location of the found instances in the integrated circuit layout may be stored, references to polygons in the integrated circuit layout, or polygons in the integrated circuit layout are marked with a specific property. The information may be stored in a database, in a computer memory, or, for example, on a compute readable memory.

Figure 2:
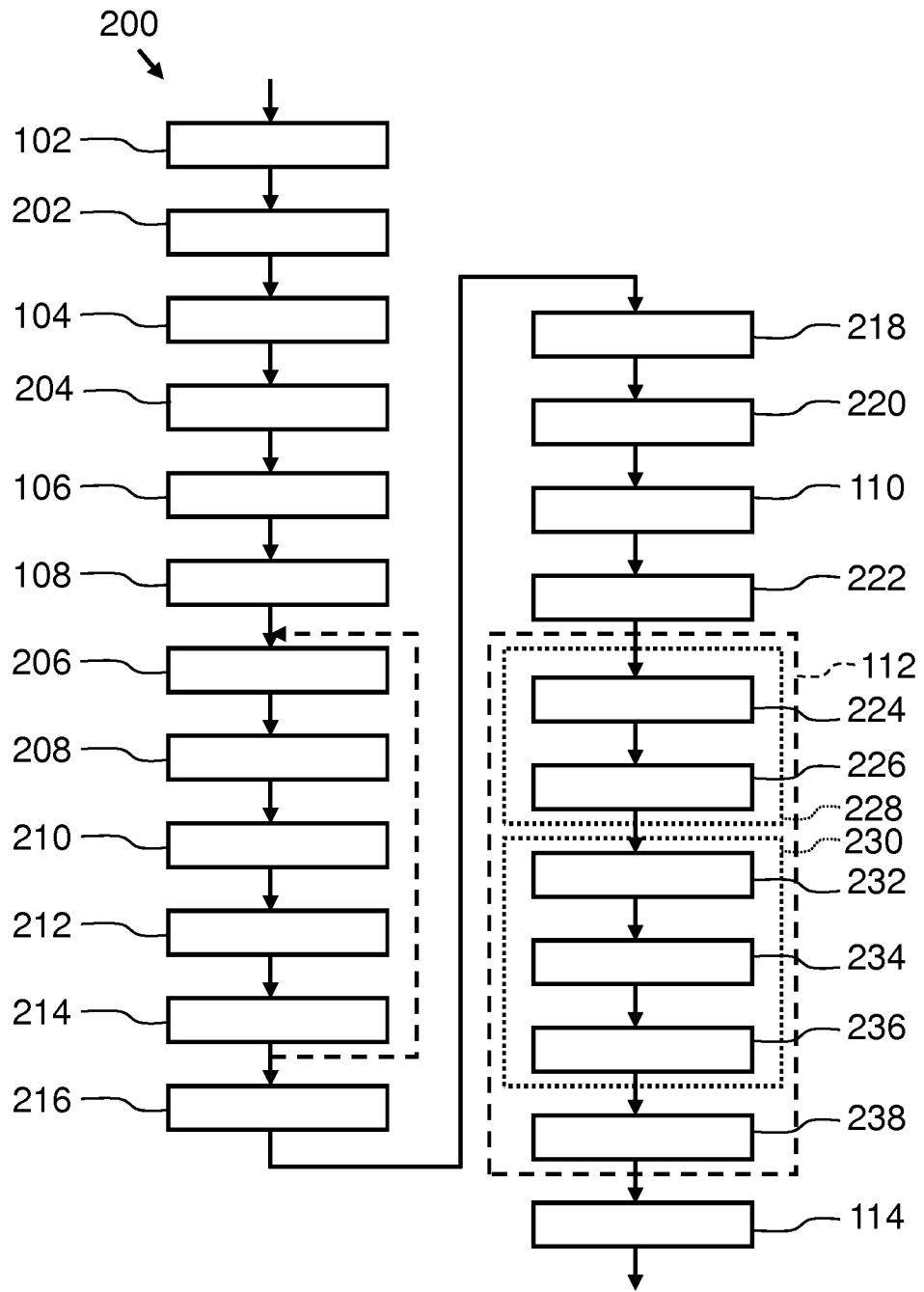

A second embodiment of a method 200 according to the first aspect of the invention is shown in FIG. 2.

In step 102, an integrated circuit layout is received as discussed previously.

In step 202, the integrated circuit is preprocessed to adapt the received integrated circuit layout on basis of one or more arithmetic operations on elements of the integrated circuit. The operations may be logic operations like "and", "or" or "not". An example is that a temporary imaginary layer is created that is the "and" of two layers of the received integrated circuit layout. The operations may also be geometry oriented operations which undersize or oversize a polygon or a path of an integrated circuit layout. 'Undersizing' means that a size of polygons or paths has to be decreased, 'oversizing' means that the size has to be increased. Any of these arithmetic operations may be combined in any order.

In step 104, as discussed previously, a drawing of a reference pattern is received from a user.

In step 204, a line selection is received from the user. The line selection is an indication of lines of the drawn reference pattern that are relevant for the checking of the integrated circuit layout for instances of the reference pattern. The user may select, for example, on a computer display which edges are relevant and/or which edges are irrelevant. In subsequent steps, only the relevant edges are taken into account.

In step 106, a basic pattern definition is deducted from the drawing of the reference pattern, as discussed previously.

In step 108, as discussed previously, a set of topological relations is determined.

In step 206, the topological relations of the set of determined topological relations are presented in the drawing of the reference pattern. This includes, for example, drawing arrows between lines and/or extremities of the lines of the drawn reference pattern, wherein the arrow represents a topological relation. In case that a computer and a computer display is used, and if the user is, for example, with a mouse pointer at the location of a specific arrow, specific characteristics of the specific topological relation is presented to the user.

In step 208, topological relation input is received from the user. The topological relation input comprises a definition of one or more specific topological relations in the drawing. The user may, for example, indicate between which specific lines and/or extremities of the drawn reference pattern a topological relation has to be defined and subsequently the user may indicate the characteristics of the topological relation. In another embodiment, the user only selects a pair of edges, a pair of corners and/or a pair of one corner and one edge, and the applicable topological relation between the entities of the pair is determined automatically.

Subsequently, in step 210, the one or more topological relations that are received from the user in the topological relation input are added to the set of determined topological relations.

In step 212, further topological relation input is received from the user. The further topological relation input comprises a selection of one or more topological relations of the determined set of topological relations that have to be removed. The user may select, for example, on a computer display which of the presented topological relations have to be deleted. The topological relations are, for example, presented in the drawing of the reference pattern. In another embodiment, the topological relations are presented in a list and the user selects one or more topological relations from the list. In yet another embodiment, the user selects a specific edge or a specific corner and all topological relations related to the selected specific edge or specific corner are the topological relations of the topological relation input.

Subsequently, in step 212, the selection of the one or more topological relations is removed from the set of determined topological relations.

It is to be noted that the step 206 of presenting the topological relations of the set of determined topological relations and the subsequently drawn steps 210 to 214 may be performed iteratively as well. Further, the combination of the steps 208 and 210 may be performed without performing the steps 212 and 214, or the steps 212 and 214 may be performed without performing the steps 208 and 210.

In step 216, one ore more geometrical predicates are received. A geometrical predicate defines a specific geometry of a specific topology of the reference pattern. Geometry relates to quantifiable characteristics of one or more elements of an integrated circuit. As far as these quantifiable characteristics relate to elements of the complex pattern description (for example, relate to edges, corners, sequence of edges, and/or topological relations) a user may provide the quantifiable characteristics as geometrical predicates. Examples of geometrical predicates are: a length of an edge, a length of a sequence of edges, a distance between pairs of edges and/or of corners, an area enclosed by a sequence of edges, a position of an edge or a corner in an integrated circuit layout with respect to a predefined reference point, a number of layout elements in a specific region, and/or the density of layout elements in a specific region of the layout. It is to be noted that the geometrical predicates may be expressed as conditions on the values, such as the length of an edge should be larger than, the enclosed area should be smaller than, or the distance between edges should be equal to. In subsequent steps the received geometrical predicates are taken into account as being a part of the complex pattern description and are taken into account when the integrated circuit layout is checked for instances of the reference pattern.

In step 218, one or more layout property predicates are received. The layout property predicates are properties describing characteristics of one or more circuit layout elements and are properties that are extractable from the integrated circuit layout. An integrated circuit layout represents an electronic circuit to be manufactured as an integrated circuit device. The layout property predicates related to the electrical characteristics of the electronic circuit that is represented by the layout. Examples of layout property predicates are: an electrical connectivity to specific to specific elements of the integrated circuit layout, being part of a specific electrical net, having a specific (electrical) parasitic value (such as capacitance or inductance). In subsequent steps the received layout property predicates are taken into account as being a part of the complex pattern description and are taken into account when the integrated circuit layout is checked for instances of the reference pattern.

In step 220, a required pattern orientation is received. The required pattern orientation is an orientation that the instance of the reference pattern has to have in the integrated circuit layout with respect to a predefined reference orientation. In subsequent steps the received required pattern orientation is taken into account as being a part of the complex pattern description and are taken into account when the integrated circuit layout is checked for instances of the reference pattern.

In step 110, the complex pattern description is formed as discussed previously.

In step 222, the complex pattern description is transformed into a complex Boolean and/or arithmetic expression. This complex expression may be used in the step of checking the integrated circuit layout for instances of the reference pattern. However, as discussed hereinafter, other means for checking the integrated circuit layout for instances of the reference pattern may be used as well.

In step 112, the integrated circuit layout is checked for complex patterns that match the complex pattern description to find instances of the complex pattern. Step 112 may be subdivided in the subsequent steps:
i) in step 228, the complex pattern description is transformed to a graph representation of the complex pattern description,
ii) in step 230, the integrated circuit layout is transformed to a graph representation of the complex pattern description,
iii) in step 238, instances of the graph of the complex pattern description are sought in the graph of the integrated circuit layout to find instances of the reference pattern.

It is to be noted that step 228 may be subdivided in two steps, namely, step 224 in which edges of the complex pattern description are mapped on a set of vertices of the graph representation, and step 226 in which the topology of the basic pattern definition and the topology relations of the complex pattern description are mapped on a set of edges of the graph representation.

It is further to be noted that step 230 may be subdivided in three steps, namely step 232 in which topological relations are determined in the integrated circuit layout, step 234 in which edges of the integrated circuit layout are mapped on a set of vertices of the graph representation, and step 226 in which the determined topology relations of the integrated circuit layout are mapped on a set of edges of the graph representation.

Finally, in step 114 the found instances of the reference pattern are stored as discussed previously.

Figure 3:
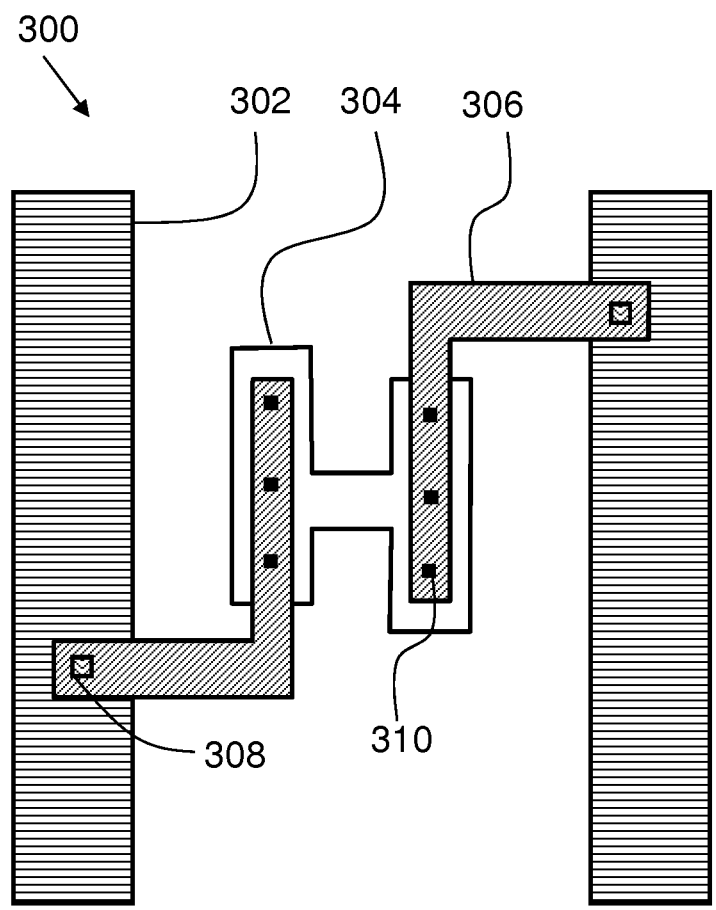

FIG. 3 schematically shows an embodiment of a part of an integrated circuit layout 300. The integrated circuit layout 300 comprises several layers CO, PO, M1, V1, M2 which each corresponds to a layer of an integrated circuit device that has to be manufactured based on the respective layer of the integrated circuit layout 300. The corresponding layers of the integrated circuit device are a contact layer, a poly layer, a first metal layer, a first via layer and a second metal layer. The layers comprise polygons 302, 304, 306, 308, 310. Polygon 304 is a polygon in the PO layer and has the shape of which the topology relates to an 'H' because most edges of the polygon are positioned with respect to each other as is in a symmetrical drawn 'H'. Further, the geometry of the polygon 304 is different from a nicely drawn symmetrical 'H'.

Figure 4A:
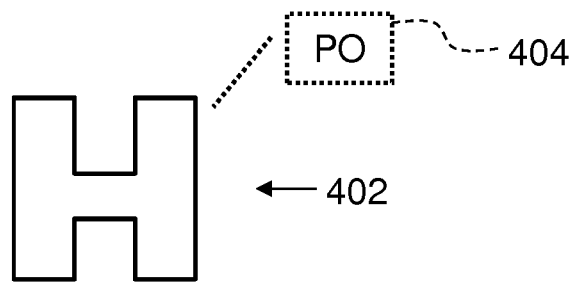

FIG. 4a schematically presents a drawing of a reference pattern 402 that is received from the user. In an embodiment, the user provides the layer property PO 404, which corresponds to the layer in which the reference pattern must be found. As seen, the reference pattern is a nicely drawn 'H' which is at least symmetric with respect to an imaginary vertical symmetry axis.

Figure 4B:
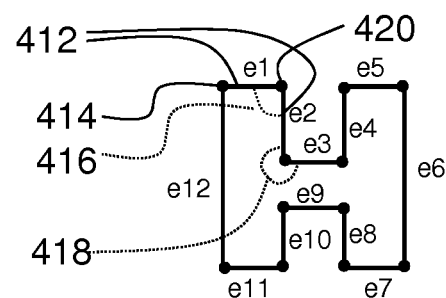

FIG. 4b schematically shows the deduction of the basic pattern definition from the reference pattern 402. Lines of the drawing are mapped on edges. Along the boundary of the polygon of the reference pattern 402, the edges 412 are numbered and by following the boundary of the polygon a set of edges {1, . . . , e12} is obtained. Further, it is deducted that one sequence of edges is present and that edge e1 is adjacent to edge e2, edge e2 is adjacent to edge e3, . . . , edge e11 is adjacent to edge e12 and edge e12 is adjacent to edge e1. Every edge 412 has two extremities, for example, edge e1 has a first corner 414 and a second corner 420. In the basic pattern definition it is described that corner 414 is the common point of edge e1 and edge e2. This information is stored for all corners. Further, it is determined what the angle between the pairs of edges of the reference pattern is. The minimal amount of angles that need to be determined in the reference pattern 402 is the angle between adjacent edges. Angles between other pairs of edges may be derived from the minimal set of deducted angles. The angle between the edges may be determined at the interior side of the drawn polygon. The angle may also be determined at the other side of the edges, however, within the context of FIG. 4b, according to an agreement, which is used in the deduction of the basic pattern definition from the reference pattern 402, the angle is measure between adjacent edges at the polygon's interior side of the edges. Thus, angle 416 is: angle(e1, e2)=angle(e4, e5)=angle (e5, e6)=angle(e6, e7)=angle(e7, e8)=angle(e10, e11)=angle (e11, e12)=angle (e12, e1)=90°, and angle 418=angle(e2, e3)=angle(e3, e4)=angle(e8, e9)=angle(e9, e10)=270°.

Figure 4C:
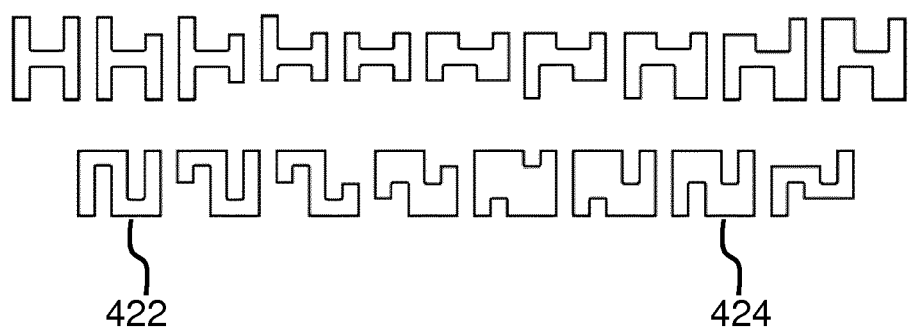

The deducted basic pattern definition corresponds to a wide variety of topologies and geometries, see FIG. 4c. All drawn patterns in FIG. 4c have a sequence of edges with corresponding angles between adjacent edges as discussed in the previous paragraph. For example, pattern 422 does certainly not look like an 'H' and has to some extent the shape of a rotated 'S'. Pattern 424 has to some extent the shape of an 'N'.

Figure 5A:
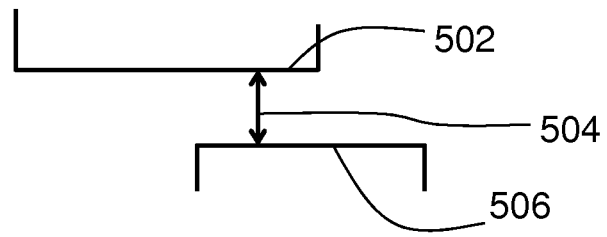
Figure 5B:
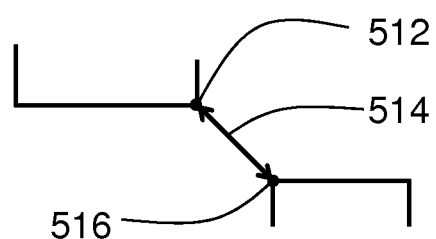
Figure 5C:
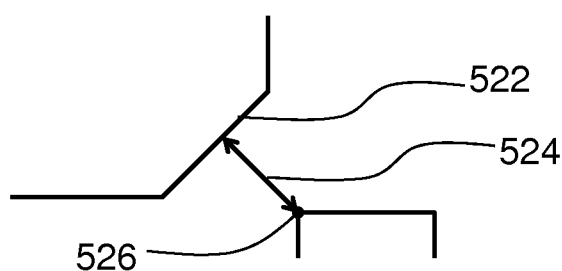

FIGS. 5a to 5c present examples of types of topological relations.

In FIG. 5a a topological relation 504 is drawn between a pair of edges of a first edge 502 and a second edge 506. The topological relation 504 specifies that the first edge 502 is parallel to the second edge 506, that the first edge 502 has a common run length with the second edge 504, and that an area between the first edge 502 and the second edge 504 along the common run length is free of other edges. The area has to touch the first edge 502 and has to touch the second edge 504. In other words, there exists a plurality of pairs of points, each pair has a point on the first edge 502 and has a point on the second edge 504, wherein the distance between the points of the pairs is a smallest possible distance among a plurality of distances between all other possible point pairs which have a first point on the first edge and have a second point on the second edge. Further, the distance between the points of the pairs is strictly smaller than the plurality of sums of two distances, where a first distance is the distance between a first point on the edge 502 and a second edge on a third edge, not being the first edge 502 and not being the second edge 504, and a second distance is the distance between the second point on the third edge and a third point on the second edge 504. This means that no other edge is present in a rectangular area located in between the first edge 502 and the second edge 504, and which touches the first edge 502 and the second edge 504.

In FIG. 5b a topological relation 514 is drawn between a pair of a first corner 512 and a second corner 516. The topological relation 514 specifies that the first corner 512 and the second corner 516 are diagonally opposite. No edges other than edges connected to the first corner 512 and to the second corner 516 being present in a non-empty area consisting of points being in between the first corner 512 and the second corner 516 and being closer to the first corner 512 than to the edges connected to the first corner 512 and being closer to the second corner 516 than to the edges connected to the second corner 516. Thus, in other words, the first corner 512 and the second corner 516 are diagonally opposite.

In FIG. 5c a topological relation 524 is presented between a pair of a corner 526 and an edge 522. The corner 526 and the edge 522 have a smallest distance between the corner 526 and a specific point on the edge 522 among all point pairs comprising a point on the edge 522 and comprising a point on one of the edges connected to the corner 526. No other edges cross a line connecting the corner 526 and the specific point on the edge 522.

Figure 6A:
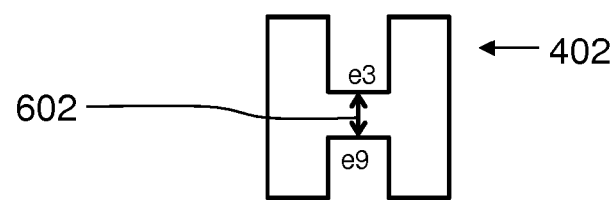
Figure 6B:
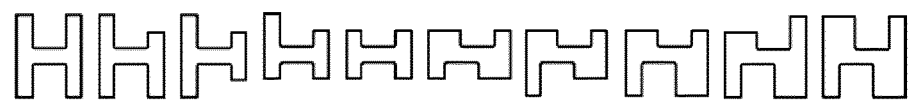

In one of the steps of the method a set of topological relations is determined between pairs of entities of the basic pattern definition. The entities are edges and corners. As discussed previously, the user may indicate the set of topological relations. FIG. 6a shows that a user has indicated a topological relation between the edges e3 and e9. The topological relation 602 has the meaning of: the edges e3 and e9 have to be parallel to each other, need to have a common run length, and there is at least a rectangular area in between the edges e3 and e9 without any other edge, the rectangular area has to touch edge e3 and has to touch edge e9. The topological relation 602 is of the type of the topological relation type that is shown in FIG. 5a. In FIG. 6b it is shown what this means for the earlier presented set of patterns that match the basic pattern definition. The patterns drawn in the lower part 604 of FIG. 6b, do not correspond to the basic pattern definition in which the drawn topological relation 602 of FIG. 6a is present. In the non-corresponding patterns, the edges, which correspond to edges e3 and e9 of the provided reference pattern 402, do not have the topology of the drawn topological relation 602. In other words, one of the conditions of the topological relations is not fulfilled by the specific edges e3 and e9 of the non-corresponding patterns.

Together with FIG. 7, FIGS. 8a and 8b, and FIGS. 9a, 9b and 9c other types of topological relations are discussed.

Figure 7:
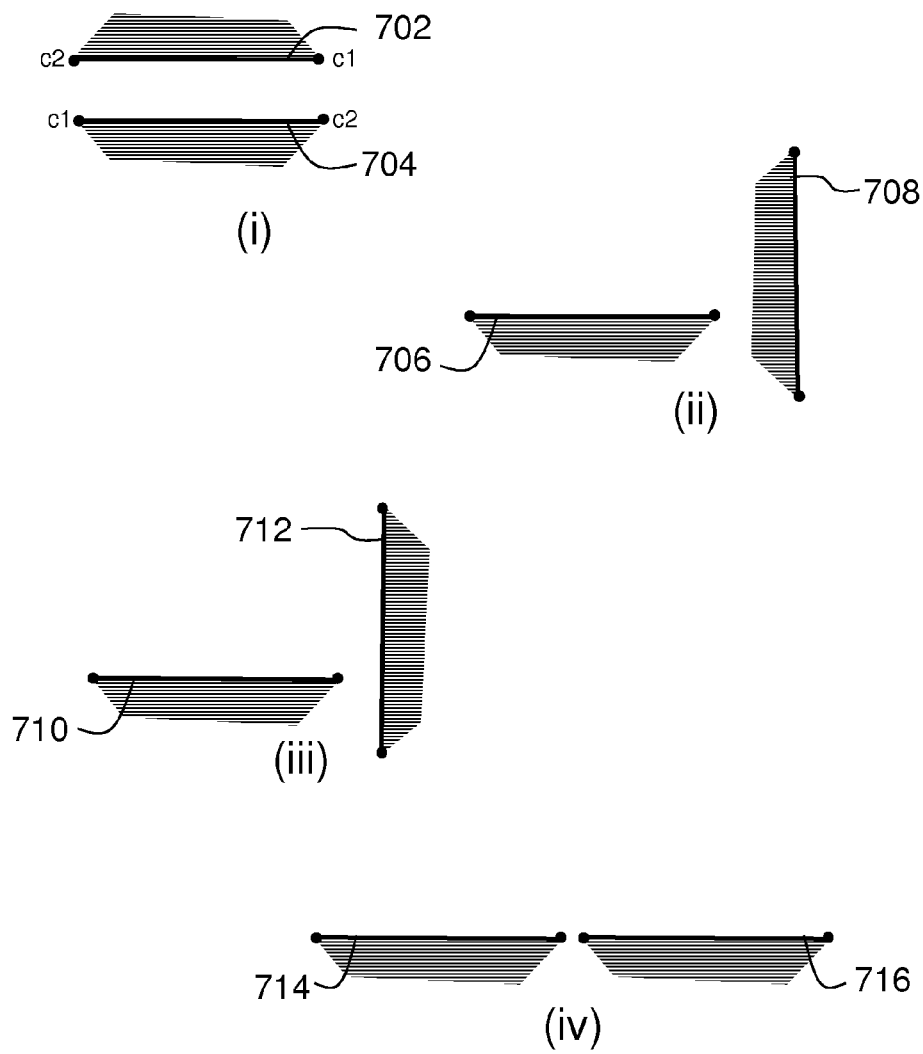

If it is assumed that allowed inclinations of edges of the reference pattern are only 0, 90, 180 and 270 degrees, in FIG. 7 four different situations (i)-(iv) are presented which represent all possible angles between two edges. In situation (i) two edges 702, 704 are drawn. Of each edge 702, 704 the side of the edge that is facing an interior of a polygon is indicated by a hatched region. The first edge 702 has the interior of the polygon above the edge, and the second edge 704 has the interior of the polygon below the edge. The basic pattern definition that is deducted from the reference pattern may also define which side of the edge faces towards the interior of the polygon.

According to an agreement, a first corner of an edge is defined as the first corner that is passed when the edge is followed in a direction where the interior of the polygon is at the right hand side of the edge. A second corner of the edge is the corner that comes second when the edge is followed in a direction where the interior of the polygon is at the right hand side of the edge. For edges 702, 704 the first corner c1 and the second corner c2 are indicated.

Further, the angle between a first edge of a pair and a second edge of a pair is defined as the angle that is present between the first edge and the second edge at the interior side of the polygon when the second edge is virtually translated to a position such that its first corner has the same position as the second corner of the first edge. Thus, the virtual translation of the second edge 704 of situation (i) would imply that the edges are virtually positioned right on top of each other. After the virtual translation, the angle between the first edge 702 and the second edge 704 at the interior side of the polygon is 360°, which is equal to 0°. Further, in accordance with the above described definition, in situation (ii) the angle between edge 706 and edge 708 is 90°, in situation (iii) the angle between edge 710 and edge 712 is 270°, and in situation (iv) the angle between edge 714 and edge 716 is 180°.

Figure 8A:
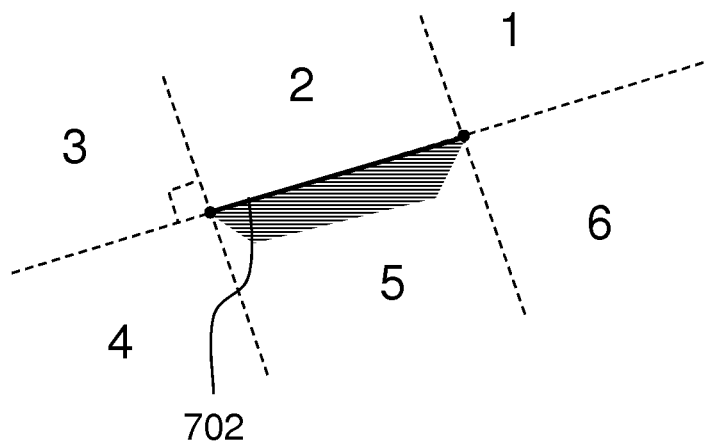

FIG. 8a shows how an edge virtually splits up an area around an edge 702. The area actually is the entire 2D plane. The area is subdivided in sub-areas 1 to 6. The sub-areas 1 to 3 are located at a side of the edge 704 that is facing away from the interior of the polygon. The sub-areas 4 to 6 are located at an side of the edge that is facing towards the interior of the polygon. The borders between sub-areas 1 to 3 are formed by normal axes to the edge 702 that intersect the edge in its corners. These normal axes also form the borders between sub-areas 4 to 6. The defined sub-areas may be used to check how edges in a pattern or in an integrated circuit layout are related to each other. It may be checked, for example, in which sub-areas of a first edge corners of a second edge are located and as such the relative position between the first edge and the second edge is determined. Or it may be checked, for example, in which sub-areas of the first edge (a part of) the second edge is located.

The combination of describing an angle between a first edge and a second edge, for example on basis of the definition of FIG. 7, and by describing in which sub-areas of the first edge (a part of) the second edge is present, one may define specific topological situations. In the subsequent part of this document different topological relations types are defined by using such means. Topological relations of such types may be found in an integrated layout or in a pattern by checking the conditions of the definition between pairs of edges or corners.

The topology of two edges that cross each other may formally be defined by:

CROSS (edge1, edge2)=
"the angle between edge1 and edge2 is neither 0° nor 180°" and
"edge2 does not completely lie in the union of sub-areas 1, 2, 3 or the union of sub-areas 4, 5, 6 of edge1 " and
"edge1 does not completely lie in the union of sub-areas 1, 2, 3 or the union of sub-areas 4, 5, 6 of edge2 ".

Figure 8B:
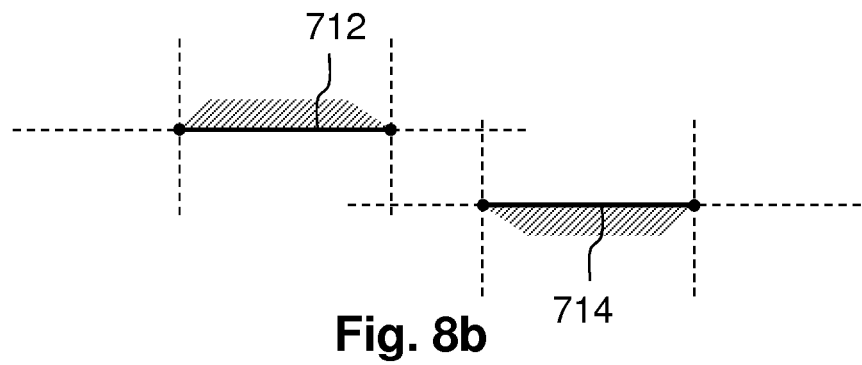
Figure 8C:
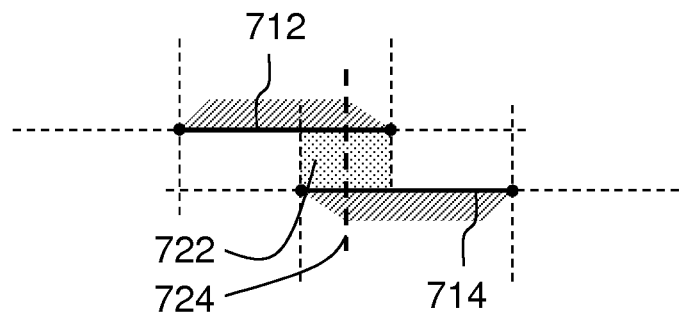

The topology of two parallel edges whose interior sides face away from each other (e.g. situation (i) of FIG. 7, or the topology of FIG. 8b, or the topology of FIG. 8c) may formally be defined by:

"the angle between edge1 and edge2 is 0°" and
"edge2 lies in the union of sub-areas 1, 2, 3 of edge1 " and
"edge1 lies in the union of sub-areas 1, 2, 3 of edge2 ".

FIG. 8c presents the topology of two edges 712, 714 having a common run length. However, also in a situation that another edge is in between edge 712 and edge 714, edge 712 and edge 714 have a common run length. The formal definition of common run length may be:

CRL(edge1, edge2)=
"the angle between edge1 and edge2 is 0° or 180°" and
"one of the edges {edge1, edge2 } has an extremity in sub-area 2 or 5 of the other edge of {edge1, edge2 }".

FIG. 8c presents also the topology of a pair of edges 712, 714 of edge1 and edge2 having an unobstructed view along their common run length. This is a complicated topology to define in terms of angles between the edges and the relative positions of the edges with respect to each other. It is a complex definition because all other edges available in the environment of the edges 712, 714 are involved in the definition. An unobstructed view means that there exists a line perpendicular to edge1 and edge2 which intersects with edge1 and edge2, such that no other edge lying wholly or partly between edge1 and edge2 intersects this line. Such a line 724 is drawn in FIG. 8c. In order to obtain a formal definition in terms of the edges and the sub-area of the edges, a region between two parallel edges is defined by the expression BETWEEN(edge1, edge2). In FIG. 8c such a BETWEEN region 722 is indicated. The formal definition of BETWEEN(edge1, edge2) may be:

BETWEEN(edge1, edge2)=
"the intersection of region A of edge1 and region B of edge2, wherein region A equals sub-area 2 of edge1 if edge2 lies in the union of sub-areas 1, 2, 3 of edge1, wherein region A equals subarea 5 of edge1 if edge2 lies in the union of sub-areas 4, 5, 6 of edge1, wherein region B equals sub-area 2 of edge2 if edge1 lies in the union of sub-areas 1, 2, 3 of edge2, and wherein region B equals sub-area 5 of edge2 if edge1 lies in the union of sub-area 4, 5, 6 of edge2 ".

Then, edge1 and edge2 have an unobstructed view along a part of their common run length if the predicate PARTIAL_VIEW defined below is true:

PARTIAL_VIEW(edge1, edge2)=
"region BETWEEN(edge1, edge2) is not covered by the totality of regions BETWEEN(X, edge1) and BETWEEN(X, edge2), where X ranges over all edges parallel to edge1 and edge2 (but excluding edge1 and edge2) and having the same above/below relationship with respect to edge1 as edge2 has, and having the same above/below relationship with respect to edge2 as edge1 has."

A variant is a topology relation where edge1 and edge2 have an unobstructed view completely along their common run length. This type of topology relation is called FULL_VIEW:

FULL_VIEW(edge1, edge2)="region BETWEEN(edge1, edge2) is disjoint with the totality of regions BETWEEN (X, edge1) and BETWEEN(X, edge2), where X ranges over all edges parallel to edge1 and edge2 (but excluding edge1 and edge2) and having the same above/below relationship with respect to edge1 as edge2 has, and having the same above/below relationship with respect to edge2 as edge1 has." It is to be noted that the topology type FULL_VIEW(edge1, edge2) is the topology type 504 of FIG. 5a and the topology of FIG. 8c.

Figure 9A:
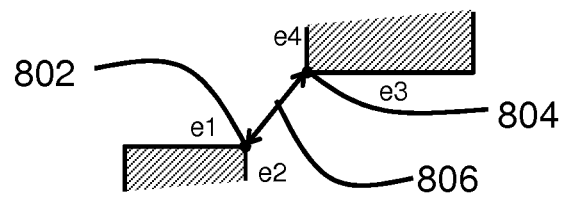

In FIG. 9a a topology relation type 806 is presented. The topology relation type 806 is a relation between two diagonally opposite corners that have an unobstructed view, which is the same topology relation 514 as the one of FIG. 5b. This relation is also defined in the same formal language as the relations of FIGS. 8a to 8c were defined. In order to define the topology relation type 806 correctly, a SECTOR related to two adjacent edges is defined by:

SECTOR(edge1, edge2)=
"an intersection that contains the tip of the corner formed by the two edges and is the largest intersections of: the intersection of region 1 of one edge and region 3 of the other edge, or the intersection of region 4 of one edge and region 6 of the other edge.

Figure 9B:
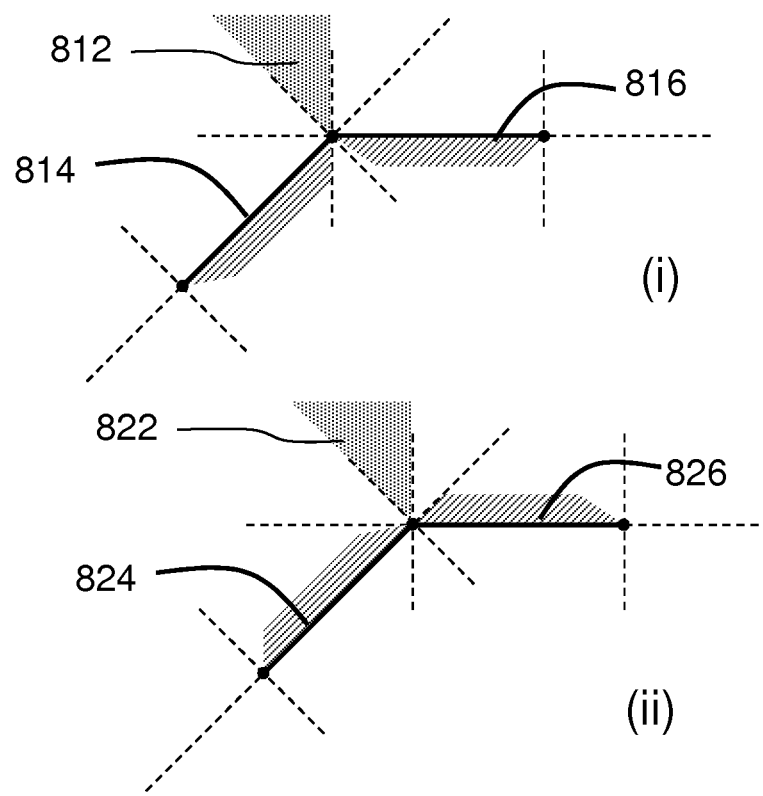

This is shown in FIG. 9b. In situation (i) sector 812 is SECTOR(edge 814, edge 816). In situation (ii) sector 822 is SECTOR(edge 826, edge 824).

The definition of SECTOR(edge1, edge2) is used to define whether two corners are diagonally opposite. If the definition predicate DIAGONALLY_OPPOSITE( . . . ) given below, is true, the corner of adjacent edge1 and edge2, and the corner of adjacent edge3 and edge4, are diagonally opposite:

DIAGONALLY_OPPOSITE(edge1, edge2, edge3, edge4)=
"edge1 and edge2 are adjacent" and
"edge3 and edge4 are adjacent" and
"the common point of edge3 and edge4 lies in SECTOR (edge1, edge2)" and
"the common point of edge1 and edge2 lies in SECTOR (edge3, edge4)"

The topology relation 806 of FIG. 9a is between two diagonally opposite corner, but, as also discussed in the context of FIG. 5b, the two corners form a closest point pair, which means that they have an unobstructed view to each other. This may be defined by:
DIAGONALLY_UNOBSTRUCTED_VIEW(edge1, edge2, edge3, edge4)=
"DIAGONALLY_OPPOSITE(edge1, edge2, edge3, edge4)" and
"no edgeX intersects with the interior of the intersection of SECTOR(edge1, edge2) and SECTOR(edge3, edge4), wherein edgeX ranges over all edges (excluding edge1 and edge2)"

Figure 10A:
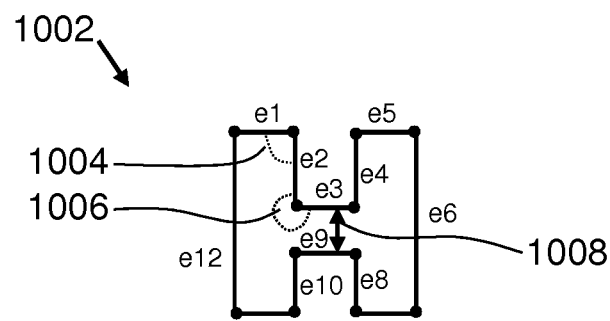
FIG. 10a presents a pattern which is being mapped on t graph representation.
Figure 10B:
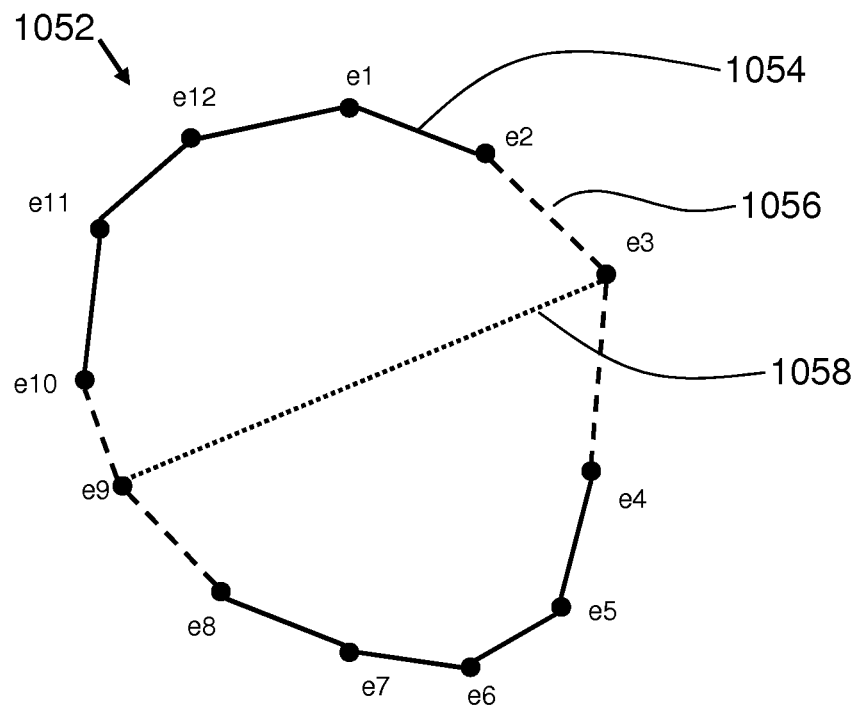
FIG. 10b presents a graph representation of the pattern of FIG. 10a, and FIG. 11 schematically shows an embodiment of a system checking an integrated circuit layout for instances of a complex pattern according the third aspect of the invention.

FIG. 10a shows the reference pattern 1002 of an 'H' in which the edges e1 . . . e12, corners and one topological relation 1008 are drawn. The basic pattern definition describes the sequence of edges e1 to e12 wherein e1 is adjacent to e2, edge e2 is adjacent to e3 , . . . , and edge e12 is adjacent to e1. Further, the set of topological relations comprises information about the angle between adjacent edges. The angle 1004 between e1 and e2 is 90°, the angle 1006 between e2 and e3 is 270°, . . . , and the angle between e12 and e1 is 90°. The set of topological relations further comprises one topological relation 1008 which is a relation between opposite parallel edges e3 and e9. The set of topological relations and the basic pattern definition form the complex pattern definition. The complex pattern definition is transformed to a graph representation of the complex pattern definition. The graph representation 1052 in FIG. 10b is the graph representation of the pattern of FIG. 10a. The vertices of the graph are formed by the edges e1 to e12. The edges between the vertices of the graph are formed by the adjacency and angle relations of the basic pattern definition and the topological relation of the set of topological relation. For example, edge 1054 of the graph represents that edge e1 and edge e2 of the pattern are adjacent and that the angle 1004 between the two edges is 90°. Edge 1056 of the graph represents that edge e2 and edge e3 of the pattern are adjacent and that the angle 1006 between the edges is 270°. Edge 1058 of the graph represents the topological relation 1008 between edge e3 and edge e9 of the pattern and is the topological relation of two parallel edges that are positioned opposite each other.

An integrated layout may be transformed into a graph representation in the same way as presented with FIGS. 10a and 10b. The pattern 1002 may be found by finding a subgraph in the graph representation of the integrated circuit layout that is equal to graph 1052.

Figure 11:
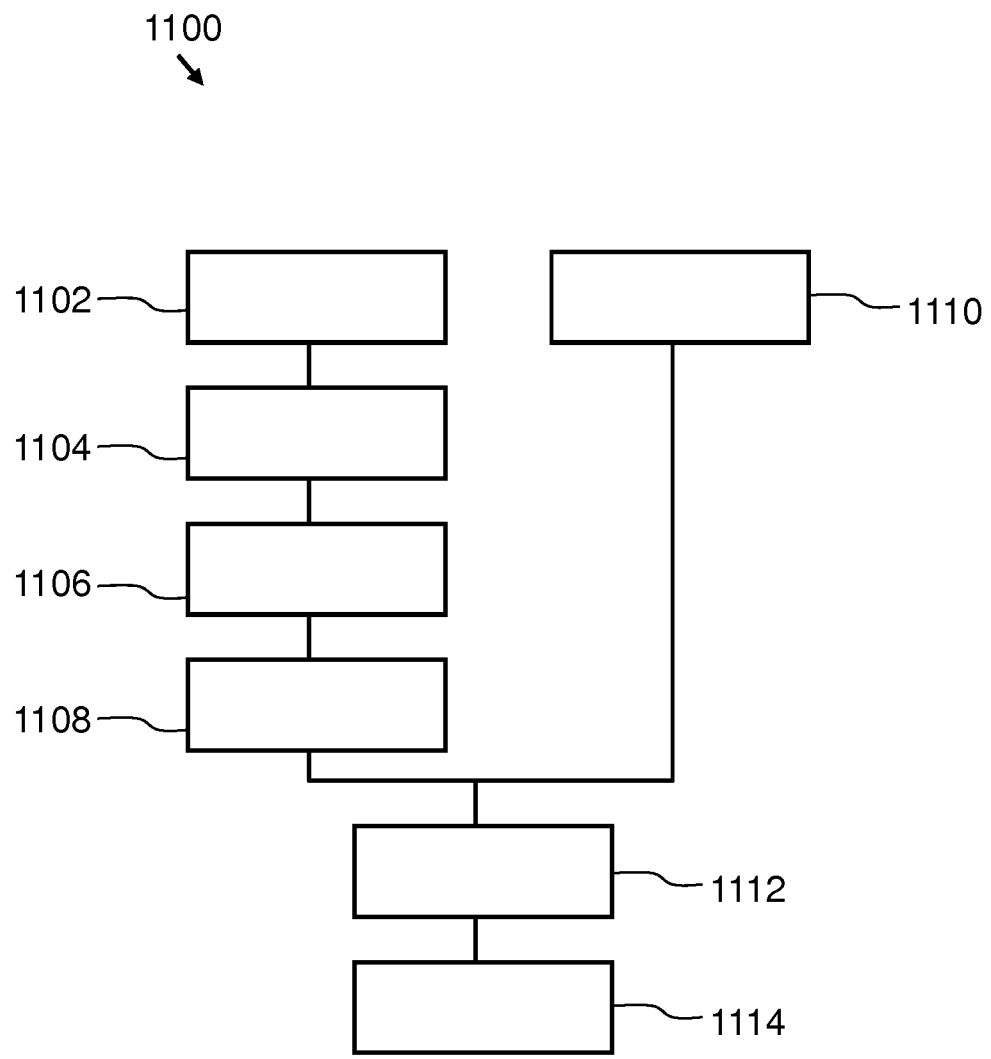

FIG. 11 presents a system 1100 according to the third aspect of the invention. The system 1100 checks an integrated circuit layout for instances of a complex pattern. The system 1100 comprises a layout input means 1110, a pattern input means 1102, a deducting means 1104, a determination means 1106, a forming means 1108, a checking means 1112, a storing means 1114. The layout input means 1110 receives the integrated circuit layout. The pattern input means 1102 receives a drawing of a reference pattern from a user. The deducting means 1104 deducts a basic pattern definition from the drawing. The basic pattern definition comprises one or more sequences of successive edges which correspond to lines in the drawing, and comprises corners which correspond to extremities of the lines in the drawing, and angles between edges. A corner being a first point of a first edge of the sequence, is a last point of a last edge of the sequence, or is a common point of two successive edges. The determination means 1106 determines a set of topological relations between pairs of two edges of the basic pattern definition, pairs of two corners of the basic pattern definition or pairs of one edge and one corner of the basic pattern definition. The forming means 1108 forms the complex pattern definition from the deducted basic pattern definition and the set of topological relations. The checking means 1112 checks the integrated circuit layout for instances of complex patterns that match the complex pattern description. The storing means 1114 stores found instances of the complex pattern.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. Use of the verb "comprise" and its conjugations does not exclude the presence of elements or steps other than those stated in a claim. The article "a" or "an" preceding an element does not exclude the presence of a plurality of such elements. The invention may be implemented by means of hardware comprising several distinct elements, and by means of a suitably programmed computer. In the system claim enumerating several means, several of these means may be embodied by one and the same item of hardware. The mere fact that certain measures are recited in mutually different dependent claims does not indicate that a combination of these measures cannot be used to advantage.

The invention claimed is:

1. A method of checking an integrated circuit layout for instances of a reference pattern, the integrated circuit layout representing a design of an integrated circuit device, the reference pattern being a topology of one or more integrated circuit layout elements, the method comprising:
   receiving integrated circuit layout,
   receiving drawing of the reference pattern from a user,
   deducting a basic pattern definition from the drawn reference pattern, the basic pattern definition comprising one or more sequences of one or more successive edges corresponding to lines in the drawn reference pattern, and comprising corners corresponding to extremities of the lines in the drawing, a corner being a first point of a first edge of the sequence, being a last point of a last edge of the sequence, or being a common point of two successive edges,
   determining a set of topological relations based on the drawn reference pattern, the topological relations being defined between pairs of two edges of the basic pattern definition, between pairs of two corners of the basic pattern definition and/or between pairs of one edge and one corner of the basic pattern definition, the topological relation defining a specific topology between the corners and/or edges of the pairs, at least a topological relation between a first corner and a second corner capable of being determined, if the first corner and the second corner are diagonally opposite one another,
   forming a complex pattern description being a combination of the deducted basic pattern definition and the set of topological relations,
   checking the integrated circuit layout for patterns that match the complex pattern description to find instances of the reference pattern in the integrated circuit layout,
   storing found instances of the reference pattern.

2. The method according to claim 1 further comprising presenting the determined set of topological relations in the drawing of the reference pattern.

3. The method according to claim 1 further comprising:
   receiving topological relation input from the user, the topological relation input comprising a definition of one or more specific topological relations in the drawing, adding the specific topological relations to the determined set of topological relations on basis of the topological relation input.

4. The method according to claim 1 further comprising:
receiving further topological relation input from the user, the further topological relation input comprising a selection of one or more topological relations of the determined set of topological relations, and
removing the selected topological relations from the determined set of topological relations on basis of the further topological relation input.

5. The method according to claim 1 further comprising receiving a line selection from the user, the line selection being an indication of lines of the drawn reference pattern that are relevant for the checking of the integrated circuit layout for instances of the reference pattern, the line selection being taken into account in the deducting of a basic pattern definition and the determining a set of topological relations.

6. The method according to claim 1, wherein
the integrated circuit layout comprises polygons representing integrated circuit layout elements or parts of integrated circuit layout elements,
the sequence of successive edges defines at least a portion of a polygon,
the basic pattern definition further defines a side of at least one edge of the sequence of successive edges which faces an interior of the portion of the polygon.

7. The method according to claim 1, wherein
the integrated circuit layout comprises a layer representing a layer of the integrated circuit device or a part of the layer of the integrated circuit device,
the basic pattern definition further defining a layer property of each sequence of edges,
the step of checking the integrated circuit layout for patterns that match the complex pattern description further takes into account the layer property.

8. The method according to claim 1, wherein each one of the topological relations of determined set of topological relations is of a type which is part of a predetermined set of topological relation types, the predetermined set of topological relation types comprising topological relation types between:
i) a first edge and a second edge being adjacent in a sequence of edges of the basic pattern definition and having a specific angle between the first edge and the second edge,
ii) a first corner and a second corner, the first corner being a point of a first specific edge or being a point of a first specific edge and a second specific edge, the second corner being a point of a third specific edge being a point of a third specific edge and a fourth specific edge, the first corner being diagonally opposite the second corner meaning that the first corner and the second corner have a smallest distance among all possible point pairs of a point of the first specific edge or of the second specific edge, and a point on the third specific edge or of the fourth specific edge,
iii) a first corner and a second corner being diagonally opposite, no edges other than edges connected to the first corner and to the second corner being present in an area defined by points being in between the first corner and the second corner and being closer to the first corner than to the edges connected to the first corner or being closer to the second corner than to the edges connected to the second corner,
iv) a corner and an edge, the corner being a common point of a first specific edge and a second specific edge, the corner and the edge having a smallest distance between the corner and a specific point on the edge among all point pairs comprising a point on the edge and a point on a first specific edge or on a second specific edge, no edges cross a line that connects the corner with the specific point except the edge, the first specific edge and the second specific edge,
v) a first edge and a second edge, the first edge crossing the second edge,
vi) a first edge and a second edge, the first edge being parallel to the second edge,
vii) a first edge and a second edge, the first edge being parallel to the second edge and an interior side of the first edge facing away from an interior side of the second edge,
viii) a first edge and a second edge, the first edge being parallel to the second edge and an interior side of the first edge facing towards an interior side of the second edge,
ix) a first edge and a second edge, the first edge, being parallel to the second edge an interior side of the first edge facing towards an exterior side of the second edge,
x) a first edge and a second edge, the first edge being parallel to the second edge and the first edge having a common run length with the second edge,
xi) a first edge and a second edge, the first edge being parallel to the second edge, the first edge having a common run length with the second edge, and no other edge being present in a rectangular portion of an area between the first edge and the second edge along their common run length, the rectangular portion of the area touching the first edge and touching the second edge, and
xii) a first edge and a second edge, the first edge being parallel to the second edge, the first edge having a common run length with the second edge, and no other edge being present in an rectangular area between the first edge and the second edge along their common run length, the rectangular area touching the first edge and touching the second edge.

9. The method according to claim 1, wherein the checking for the complex pattern comprises:
transforming the complex pattern description to a graph representation of the complex pattern description,
transforming the integrated circuit layout to a graph representation of the integrated circuit layout,
finding instances of the graph of the complex pattern description in the graph of the integrated circuit layout for finding instances of the reference pattern.

10. The method according to claim 9, wherein the step of transforming the integrated circuit layout to a graph representation comprises determining topological relations in the integrated circuit layout.

11. The method according to claim 10, wherein
the transforming of the integrated circuit layout to the graph representation comprises i) mapping edges of the integrated circuit layout on a set of vertices of the graph representation, and ii) mapping basic topological information of the integrated circuit layout and the determined topological relations of the integrated circuit layout on a set of edges of the graph representation.

12. The method according to claim 9, wherein
the transforming of the complex pattern description to the graph representation comprises i) mapping edges of the complex pattern description on a set of vertices of the graph representation, and ii) mapping topological information of the basic pattern definition and the topological relations of the complex pattern description on a set of edges of the graph representation.

13. The method according to claim 1 further comprising receiving one or more geometrical predicates, a geometrical predicate defining a specific geometry of a specific topology of the reference pattern, and wherein
- in the forming of a complex pattern description the received geometrical predicates are included in the complex pattern description, and
- the checking of the integrated circuit layout for patterns that match the complex pattern description further takes into account the received geometrical predicates.

14. The method according to claim 1 further comprising receiving one or more layout property predicates, the layout property predicates being properties describing characteristics of one or more circuit layout elements and being extractable from the integrated circuit layout, and wherein
- in the forming of a complex pattern description the received layout property predicates are included in the complex pattern description, and
- the checking of the integrated circuit layout for patterns that match the complex pattern description further takes into account the layout property predicates.

15. The method according to claim 1 further comprising receiving a required pattern orientation, the required pattern orientation being an orientation that the instance of the reference pattern has to have in the integrated circuit layout with respect to a predefined reference orientation, and wherein
- in the forming of a complex pattern description the required pattern orientation is included in the complex pattern description, and
- the checking of the integrated circuit layout of patterns that match the complex pattern description further takes into account the required pattern orientation.

16. The method according to claim 1 further comprising building a complex Boolean and/or arithmetic expression from the complex pattern description, and wherein the checking of the integrated circuit layout for patterns that match the complex pattern description uses the Boolean and/or arithmetic expression to find instances of the reference pattern in the integrated circuit layout.

17. The method according to claim 1, further comprising preprocessing the integrated circuit layout by adapting the received integrated circuit layout on basis of one or more arithmetic operations on elements of the integrated circuit layout.

18. A non-transitory, computer-readable program product for checking an integrated circuit layout for instances of a complex pattern, the computer-readable program product comprising instructions for causing a processor system to perform the method according to claim 1.

19. A pattern checking system for checking an integrated circuit layout for instances of a reference pattern, the integrated circuit layout representing a design of an integrated circuit device, the reference pattern being a topology of one or more integrated circuit layout elements, the system comprising;
- a layout input means for receiving the integrated circuit layout,
- a pattern input means for receiving a drawing of the reference pattern from a user,
- a deducting means for deducting a basic pattern definition from the drawn reference pattern, the basic pattern definition comprising one or more sequences of one or more successive edges corresponding to lines in the drawn reference pattern, and corners corresponding to extremities of the lines in the drawing,
- a determination means for determining a set of topological relations based on the drawn reference pattern, the topological relations being defined between pairs of two edges of the basic pattern definition, between pairs of two corners of the basic pattern definition or between pairs of one edge and one corner of the basic pattern definition, the topological relation defining a specific topology between the corners and/or edges of the pairs, the determination means being arranged to t least determine a topological relation between a first corner and a second corner, if the first corner and the second corner are diagonally opposite one another,
- a forming means for forming the complex pattern definition being a combination of the deducted basic pattern definition and the set of topological relations,
- a checking means for checking the integrated circuit layout for patterns that match the complex pattern definition for finding instances of reference pattern in the integrated circuit layout,
- a storing means for storing found instances of the reference pattern.

* * * * *